United States Patent
Fuller

(10) Patent No.: US 11,783,509 B2
(45) Date of Patent: Oct. 10, 2023

(54) LOCALLY VARYING NUMERICAL RANGES FOR DATA COMPRESSION

(71) Applicant: Microsoft Technology Licensing, LLC, Redmond, WA (US)

(72) Inventor: Martin Jon Irwin Fuller, Warwickshire (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 345 days.

(21) Appl. No.: 17/154,275

(22) Filed: Jan. 21, 2021

(65) Prior Publication Data

US 2022/0138989 A1     May 5, 2022

Related U.S. Application Data

(60) Provisional application No. 63/108,091, filed on Oct. 30, 2020.

(51) Int. Cl.
    *G06T 9/00*     (2006.01)
    *G06T 3/40*     (2006.01)
    *H03M 7/30*     (2006.01)

(52) U.S. Cl.
    CPC ............ *G06T 9/001* (2013.01); *G06T 3/4007* (2013.01); *H03M 7/3064* (2013.01); *H03M 7/3066* (2013.01); *H03M 7/6011* (2013.01)

(58) Field of Classification Search
    CPC .... G06T 9/001; G06T 3/4007; H03M 7/3064; H03M 7/3066; H03M 7/6011
    See application file for complete search history.

(56) References Cited

U.S. PATENT DOCUMENTS

| | | | |
|---|---|---|---|
| 6,104,415 A | * | 8/2000 | Gossett .................. G06T 15/04 345/531 |
| 8,542,243 B2 | | 9/2013 | Rogers |
| 9,075,560 B2 | | 7/2015 | Sankuratri et al. |
| 10,148,972 B2 | | 12/2018 | Moguillansky et al. |

(Continued)

FOREIGN PATENT DOCUMENTS

WO     2019055918 A1     3/2019

OTHER PUBLICATIONS

"Introducing Oodle Kraken!", Retrieved from: http://www.radgametools.com/, Retrieved Date: Aug. 6, 2020, 2 Pages.

(Continued)

*Primary Examiner* — Charles T Shedrick
(74) *Attorney, Agent, or Firm* — Klarquist Sparkman, LLP

(57) ABSTRACT

Data compression techniques are described for saving memory space by using fewer bits to store information while achieving high fidelity. A data set may be partitioned into a plurality of regions. Locally varying numerical ranges of data values (e.g., the minimum and maximum extents) may be determined for the plurality of regions. The data in the individual regions may be encoded using a lower number of bits as interpolation values in reference to the local extents rather than being encoded using a higher number of bits as absolute values. Where there are multiple channels of data in the regions, the number of available bits for encoding the data may be dynamically allocated per region based on the relative degrees of variance in data among the multiple channels.

23 Claims, 9 Drawing Sheets

(56) References Cited

U.S. PATENT DOCUMENTS

| | | |
|---|---|---|
| 10,510,164 B2 | 12/2019 | Iourcha et al. |
| 10,699,443 B2 | 6/2020 | Fuller et al. |
| 2019/0075319 A1* | 3/2019 | Gaedke ................ H04N 19/176 |
| 2021/0026508 A1* | 1/2021 | Jacobs ...................... G06T 1/20 |
| 2022/0138989 A1* | 5/2022 | Fuller .................. H03M 7/6011 |
| | | 382/232 |
| 2023/0017659 A1* | 1/2023 | Thonat .................... G06T 17/20 |

OTHER PUBLICATIONS

"Understanding BCn Texture Compression Formats", Retrieved from: http://www.reedbeta.com/blog/understanding-bcn-texture-compression-formats/, Feb. 12, 2012, 13 Pages.

Dick, et al., "Efficient Geometry Compression for GPU-based Decoding in Realtime Terrain Rendering", In Proceedings of Computer Graphics Forum, vol. 28, Issue 1, Mar. 2009, pp. 1-16.

Hruska, Joel, "Microsoft's New Xbox Series X Compression Tech Might Solve Next-Gen Storage Woes", Retrieved from: https://www.extremetech.com/gaming/310348-microsoft-xbox-series-x-compression-tech, May 11, 2020, 13 Pages.

\* cited by examiner

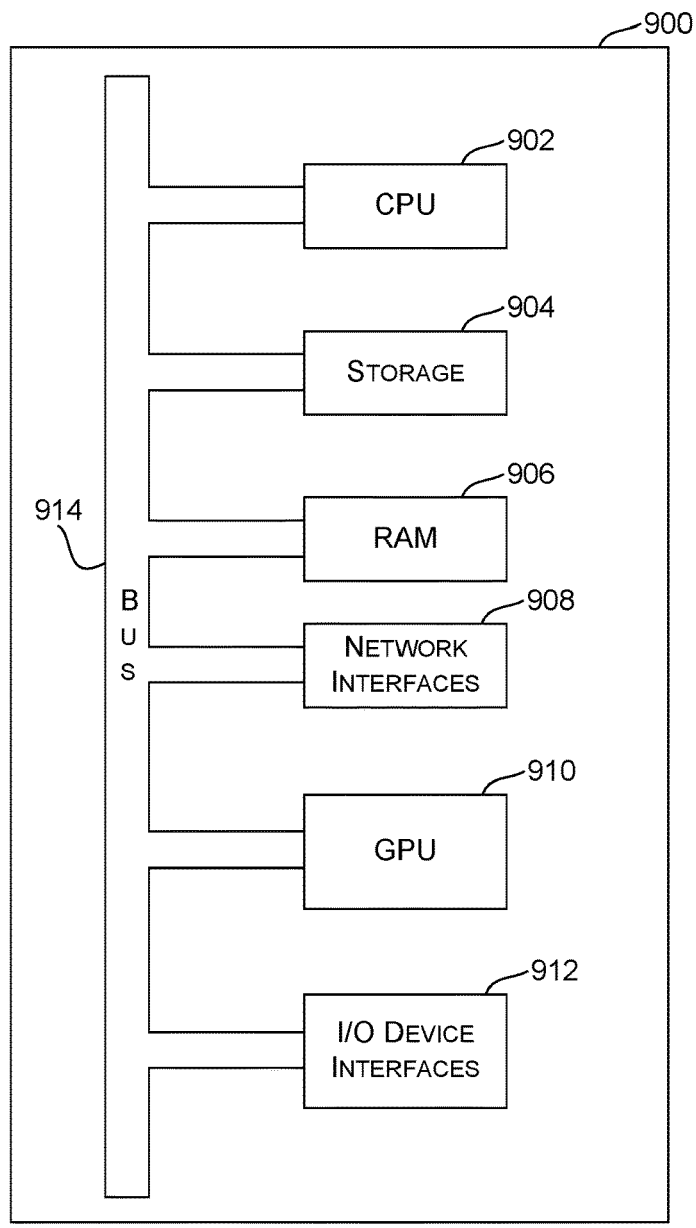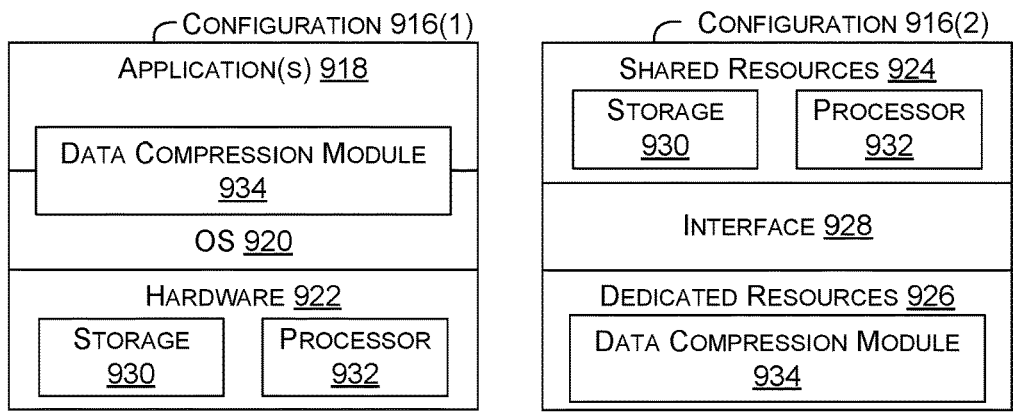
FIG. 9

LOCALLY VARYING NUMERICAL RANGES FOR DATA COMPRESSION

BACKGROUND

The limited availability of memory storage space has been an ongoing problem since the beginning of the computer information age. This problem gave rise to the field of data compression, in which various techniques and algorithms are used to compact more information into less memory space using fewer bits.

BRIEF DESCRIPTION OF THE DRAWINGS

The accompanying drawings illustrate implementations of the present concepts. Features of the illustrated implementations can be more readily understood by reference to the following descriptions in conjunction with the accompanying drawings. Like reference numbers in the various drawings are used where feasible to indicate like elements. The accompanying drawings are not necessarily drawn to scale. In the figures, the left-most digit of a reference number identifies the figure in which the reference number first appears. The use of similar reference numbers in different instances in the description and the figures may indicate similar or identical items.

FIG. 9 illustrates an example computer for data compression, consistent with the present concepts.

DETAILED DESCRIPTION

Figure 1:
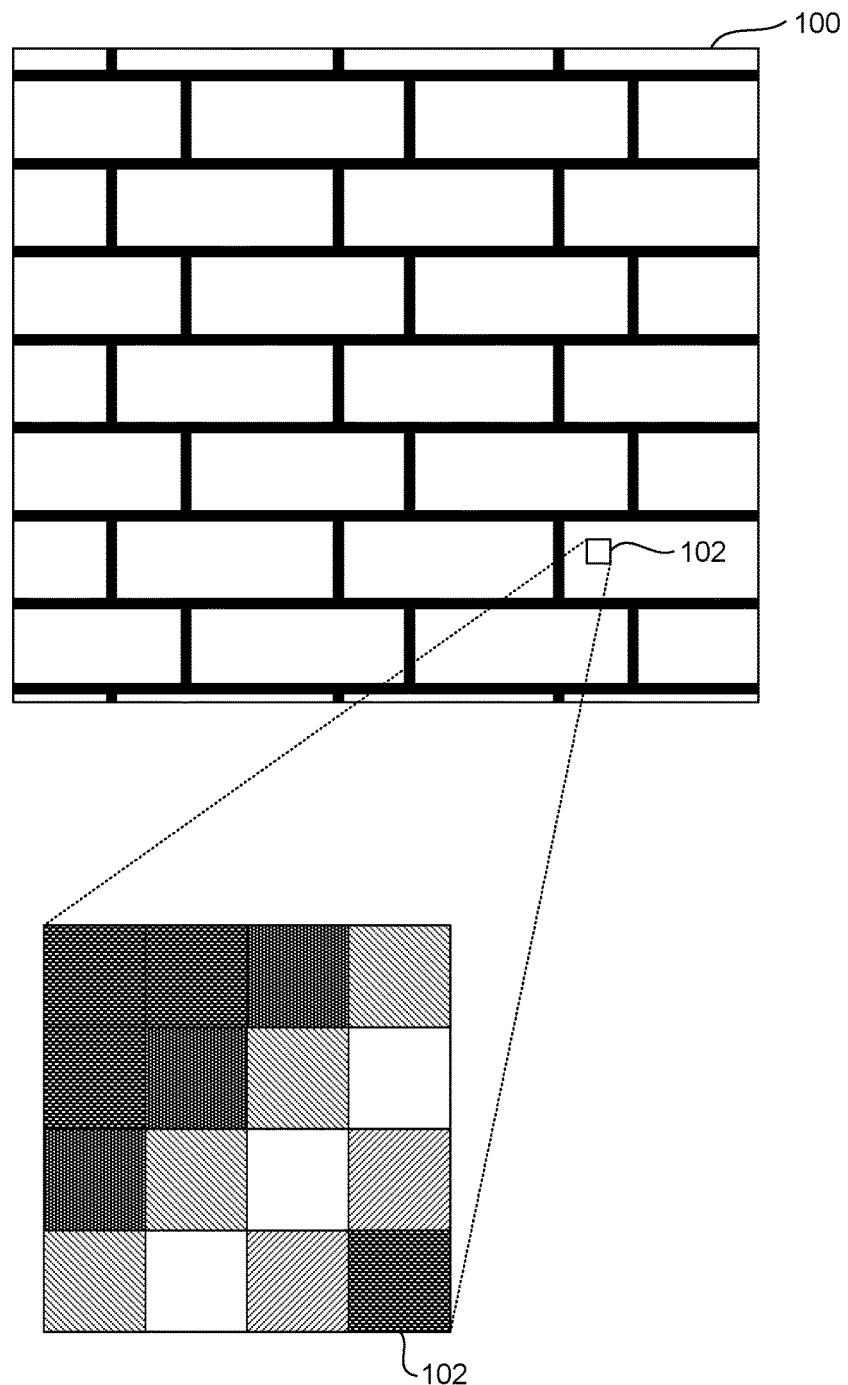
FIG. 1 illustrates an example 2-dimensional ("2D") texture, consistent with the present concepts.

The present concepts relate to data compression using locally varying numerical ranges. The concepts presented here have a wide range of applications where data can be compressed more efficiently to reduce memory size. The present concepts will be described in more detail using specific example applications in the context of computer graphics texture images, mipmaps, and geometry meshes. However, many other types of data, such as sounds, videos, graphs, etc., can be compressed using similar techniques. Therefore, the present concepts can be applied to any applications or industries that encode and store data and can benefit from data compression to reduce storage space requirements.

Information about the minimum and maximum range of data values (i.e., the minmax data) can be combined (directly or indirectly) with existing compression schemes to reduce the total dataset size. Therefore, present concepts may allow the use of a more aggressive existing compression scheme than might otherwise have been used by increasing the quality of the decompressed result. For example, a video game could use the BC1 block compression scheme instead of the BC7 scheme—BC1 being half the size of BC7—because the minmax map of the present concepts can enable the BC1 format to achieve a far higher quality level.

Encoding a large amount of information into a digital data format and storing such data can take up a significant amount of memory. Additionally, transferring large amounts of data can take an undesirable amount of time, require substantial bandwidth, and use scarce computing and networking resources. For example, computer graphics textures in video games are getting bigger in memory size to meet the demands of gamers who desire life-like graphics, detailed images, and higher resolution. In some instances, a game package can be over 100 gigabytes (GB) in size, more than a half of which can be texture data, which can take a long time to download over the Internet and can use up a significant portion of the hard drive space to store. For example, a video game console may include a fast nonvolatile memory express solid-state drive (NVMe SSD). Due to the cost of this type of storage, storage capacity may be very much at a premium. Texture data can be very large in size even when using conventional data compression techniques. Therefore, there is a need to improve data compression using more aggressive formats to save space while maintaining high quality.

The present concepts also provide the ability for existing compression techniques to encode data outside of their normal numerical range. For example, the specification for BC1 texture compression states that data is stored in the range of [0 . . . 1] for each of the RGB channels. The present concepts may use locally varying numerical ranges that can transform data held in existing compression schemes into a range outside of the original specification, for example, values larger than 1. This scheme therefore can enable existing compression schemes to store high dynamic range (HDR) or wide gamut texture data even if the existing compression specification was not designed to support such features.

The present concepts may involve compressing a data set, for example, a texture including color data or a geometry mesh including vertex position data. A texture may include, among other things, data values representing colors, for example, in RGB or RGBA format. A texture may be a single channel texture (e.g., a single channel texture with intensity values) or a multi-channel texture (e.g., a two-channel texture being a normal map specifying surface directions). A mesh may include, among other things, data values representing position coordinates of vertices, for example, in XYZ format, or in another example, coordinates for texture mapping in UV format. The data set may be subdivided into discrete regions of space or time (e.g., blocks, sections, cells, parts, or intervals). For instance, a texture may be divided into regions of square blocks containing texture pixels (called "texels"), or a mesh may be divided into regions of boxes (e.g., a cube) containing meshlets.

For some or all of the regions in the data set, a local numerical range of data values may be determined and stored in a minmax map. That is, for each region, a local minimum extent and a local maximum extent may be determined. In the case of a texture, a local minimum color value and a local maximum color value may be determined for a particular region (which may be called a "minmax texture" in this case) based on the color data for the texels in the region. In the case of a mesh, a local minimum position value and a local maximum position value may be determined for a meshlet based on the positions of the vertices in the meshlet. Accordingly, the local extents may vary from region to region. The data within each region may be encoded as interpolation values between the local minimum extent and the local maximum extent (which require relatively fewer bits) rather than being encoded as absolute values (which require relatively greater bits). Accordingly, a reduced number of bits can be used to encode the interpolation values while providing high precision compared to storing absolute values.

The present concepts can be implemented using various minmax map schemes and interpolation techniques. For example, in one implementation, the minmax map may store the local minimum and the local maximum for the regions. Therefore, a particular data value may be calculated based on the particular interpolation value and the local minimum and the local maximum for the relevant region as follows:

data value=local min+interpolation value×(local max−local min)

However, the cost of the subtraction operation may be avoided using a delta encoding scheme. For instance, in an alternative implementation, the minmax map may be a min+delta map (minimum-plus-delta map) that stores the local minimum and a delta without directly storing the local maximum. For this implementation using a min+delta map, a particular data value may be calculated based on the particular interpolation value and the local minimum and the delta for the relevant region as follows:

data value=local min+interpolation value×delta

Alternatively, the minmax map may be a max−delta map (maximum-minus-delta map) that stores the local maximum and a delta without directly storing the local minimum. For this implementation using a max−delta map, a particular data value may be calculated based on the particular interpolation value and the local maximum and the delta for the relevant region as follows:

data value=local max−interpolation value×delta

In the above three schemes, the local minimum, the local maximum, and the delta are regional values (i.e., specific to a particular region), and the data value and the interpolation value are specific to a particular data point (e.g., a texel or a vertex). Other schemes for the minmax map are possible, such as a signed interpolation value offset from a center value. In another implementation that does not use interpolation:

data value=local min+offset value or:

data value=local max−offset value

This scheme may be used to encode an index buffer for a meshlet, for example.

Furthermore, consistent with the present concepts, where there are multiple channels of data to be encoded, the number of bits available may be dynamically allocated among the channels on a region-by-region basis. For example, the number of bits assigned to store color data for the red (R) channel, the green (G) channel, and the blue (B) channel (and the alpha channel) may dynamically vary per block region. And similarly, the number of bits assigned to store coordinate data for the X channel, the Y channel, and the Z channel may dynamically vary per meshlet region.

This dynamic allocation of bits for multiple channels per local region may permit more intelligent compression schemes and can also improve quality by allocating more bits where high precision is needed in channels that have higher variance in data values.

Moreover, the present concepts may use fewer minmax values than there are channels. For example, a single minmax range may be applied to multiple channels or even all channels. For example, two minmax ranges may be used— one applies to all three RGB channels and one applies to the alpha (A) channel only.

FIG. 1 illustrates an example 2D texture 100, consistent with the present concepts. The texture 100 may be compressed using the present concepts. The texture 100 in FIG. 1 shows bricks, as an example, but the texture 100 may be any image. The texture 100 may have certain dimensions measured in pixels, for example, 1,280 pixels by 720 pixels, but the texture 100 can have any dimensions. A pixel in a texture may be called a texel (or a texture pixel). Each texel may contain color data, among others. The data set to be compressed, for example, may include the color data in all the texels of the texture 100.

Consistent with the present concepts, the data set (e.g., the texture 100 in this case) may be partitioned into multiple regions. In some implementations, the texture may be partitioned into multiple blocks 102 of a certain size. For example, as illustrated in FIG. 1, the texture 100 that is 1,280×720 pixels may be divided into a plurality of blocks 102 that are 4×4 texels in size. Other sizes for the blocks 102 are possible, such as 8×8, 16×4, 32×64, etc. Thus, each region may be a block 102 of texels containing color data. Although the texture 100 and the texels in the block 102 are shown in FIG. 1 as having only black and white colors (or various shades of gray), the example scenario discussed herein assumes that the texture 100 contains many different colors.

In some implementations, other shapes may be used for the regions, such as triangles, rectangles, hexagons, etc.; the regions may be different sizes; or the regions may be irregular shapes. Alternatively, the texture 100 may be divided into logical divisions based on the content of the texture 100. For example, if a texture includes images of land, sky, a lake, trees, etc., those discrete components may form the plurality of regions. As another example, a texture of a living room may be partitioned into a plurality of regions for various logical components in the texture, such as a region for a couch, a region for the floor, a region for a wall, and so on.

In one example implementation, the colors in the block 102 may be encoded using 16 bits per texel. A common color encoding scheme called RGB565 may use 5 bits to encode the red color value, 6 bits to encode the green color value, and 5 bits to encode the blue color value, per each pixel. However, rather than using 5-6-5 bits to encode absolute color values in accordance with the conventional RGB565 scheme used in the BC1 block compression format, the present concepts may use the 5-6-5 bits to encode interpolation values that interpolate between a local minimum color value and a local maximum color value for each region.

For each block region (e.g., the block 102 having 4×4 texels), a minimum red color value, a maximum red color value, a minimum green color value, a maximum green color value, and a minimum blue color value, and a maximum blue color value may be determined by examining each texel. These minimum and maximum values (also called "minmax values") may define the local numerical ranges of color for this particular block region. Then, the color data in each texel may be encoded as interpolation values between the minimum and the maximum within the local range using the available number of bits (5 bits or 6 bits in this case). That is, the red color component of a texel may be encoded as an interpolation red color value that interpolates between the minimum red color value and the maximum red color value, the green color component of the texel may be encoded as an interpolation green color value that interpolates between the minimum green color value and the maximum green color value, and the blue color component of the texel may be encoded as an interpolation blue color value that interpolates between the minimum blue color value and the maximum blue color value. Because storing the minmax values once for the entire region and also storing the texel color data values as interpolation values require a fewer number of bits in total compared to conventional techniques that store all the color values as absolute values, the present concepts can compress the same amount of information using less memory and/or achieve higher image quality from existing compression schemes with only a small increase in memory.

Figure 2:
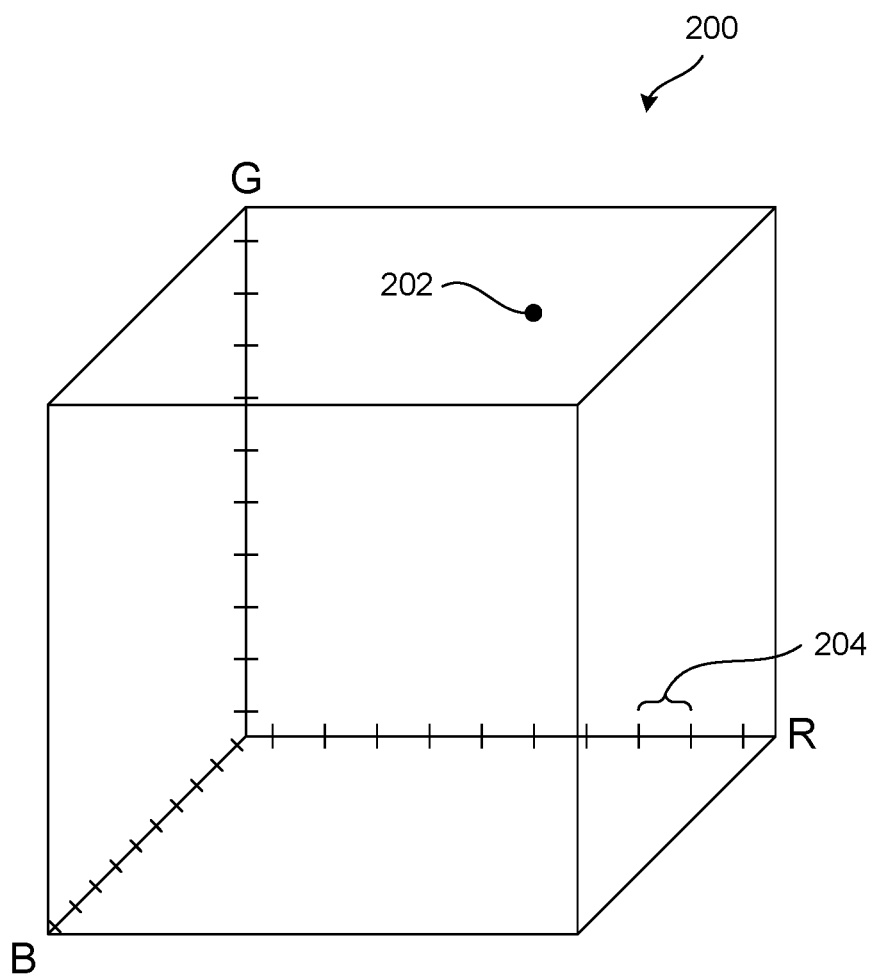
FIG. 2 illustrates a conceptual 3-dimensional ("3D") box of local numerical ranges of color, consistent with the present concepts.

FIG. 2 illustrates a conceptual 3D box 200 of local numerical ranges of color, consistent with the present concepts. The 3D box 200 may depict the minmax extents of the local ranges in the three channels (i.e., the RGB color components in this example). This 3D box 200 may be conceptually formed by the three minimum RGB values and the three maximum RGB values, thus defining the lower bounds and the upper bounds of the color values in a particular region. In some implementations, rather than storing the minimum value and the maximum value in the minmax map, computation may be saved by storing the minimum value and the delta (i.e., a min+delta map from which the maximum value can be derived), or storing the maximum value and the delta (i.e., a max−delta map from which the minimum value can be derived). The color value of a texel may conceptually be considered a point 202 in a 3D space defined by the 3D box 200 and may be stored as a set of interpolation red value, interpolation green value, and interpolation blue value.

These techniques may be repeated for each region in the texture 100. That is, the plurality of blocks 102 may each have locally varying numerical ranges. Because the size of a block region is smaller than the size of the entire texture data set, the local range of color values inside the block region may be smaller than the global range of color values inside the entire texture. Indeed, textures in general do not change colors very much within a span of only a few pixels. Thus, local ranges typically tend to be only a fraction of the size of the global range. Therefore, conventional data compression techniques require a higher number of bits to store absolute color values in a much wider global range of colors for the entire texture. On the contrary, the present concepts require a relatively fewer number of bits to store interpolation color values in a much smaller local range of colors for the block region. The use of fewer bits allows for improved data compression that takes up less memory space while providing high image quality.

The number of bits used to encode a texel's color data as an interpolation value may determine a step size 204 between the minimum and the maximum, which in turn affects the level of precision, fidelity, and image quality. Therefore, more bits may equate to a smaller step size, higher precision, and better image quality, whereas fewer bits may result in a larger step size, lower precision, and worse image quality.

Figure 3:
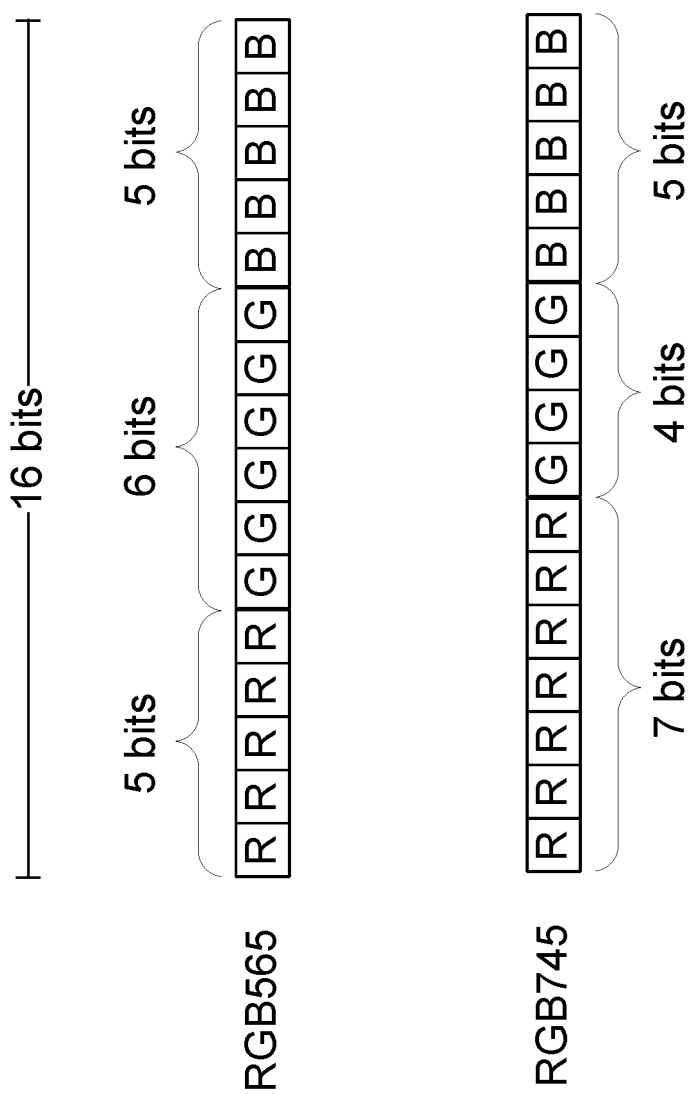
FIG. 3 illustrates example bit allocations for color encoding schemes, consistent with the present concepts.

FIG. 3 illustrates example bit allocations for color encoding schemes, consistent with the present concepts. The number of bits available to encode data may be dynamically allocated among the plurality of channels (or components of data) on a region-by-region basis. Different regions within the same data set may have different local numerical ranges of data. One of the criteria that may be used to decide how many bits to allocate to the plurality of channels may be the degree of relative variance in data among the channels. For example, the block 102 may be determined as having a relatively high variance in the red color channel and a relatively low variance in the green color channel. Therefore, the 16 bits available to encode the color data for each texel in the block 102 may be reallocated among the three RGB channels to divert more bits to the red color channel from the green color channel.

For instance, the bit allocation in accordance with the RGB745 scheme may be used instead of the RGB565 scheme to encode the colors. Using the RGB565 scheme, 5 bits may be allocated to encode a red color value, providing 32 possible interpolation values ($2^5=32$) within a local red color range between a local minimum red color value and local maximum red color value. However, using the alternative RGB745 scheme, 7 bits may be allocated to encode the red color value, providing 128 possible interpolation values ($2^7=128$) within the same local red color range. Therefore, the 2 additional bits (7−5=2) may provide quadruple the precision (128/32=4), and can greatly enhance image quality. In this example, the total sum of the bits still remains 16 bits (7+4+5=5+6+5=16). Conversely, 6 bits allocated to encode a green color value using the RGB565 scheme may be underutilized for this particular block 102 that has relatively little variance in the green color channel, and therefore, allocating only 4 bits to encode the green color value using the RGB745 scheme may result in more efficient use of the available total number of bits. Accordingly, the limited number of available bits can be more efficiently allocated to a channel that has relatively higher variance in data to better utilize the limited bits rather than wasting or underutilizing them in a channel that has relatively little to no variance in data.

In some cases, a region may be determined as having zero variance in one or more channels. For example, the colors in a region may not change at all in the red and green channels and only change in the blue channel. In such a case, zero bits may be allocated to the channel with no variance in color. In cases where colors are encoded using the RBGA color model, where the fourth alpha channel represents transparency, a region may have zero variance in transparency. For example, where a region is completely transparent or completely opaque, the alpha channel value for all texels in the region may be all 1s or all 0s. In such a case, the number of bits allocated to encode the alpha channel may be zero. In a case where a region is completely flat, i.e., no variation in color at all, all the channels may have zero delta values. Where all channels have zero variance, the graphics processing unit (GPU) may return the minimum or maximum values without having to decode the per-texel data.

These described locally varying numerical range techniques can be applied to any number of texture channels or any existing texture encoding schemes, including all of the block compression formats. For instance, a region may also contain metadata that can change the particular compression scheme used for that region, providing that the memory footprint of the high-resolution data remains the same. For example, the conventional block compression formats BC2, BC3, BC6, and BC7 all consume one byte per pixel. The metadata would allow textures to use different compression schemes for different regions, so as to mix BC2, BC3, BC6, BC7, or R8 (single channel) uncompressed form, where only one texture channel has any variance, for example.

To further illustrate the present concepts using concrete example numbers, for a given block region of a texture data set, each texel in the block region may use 16 bits to encode the color data: 5 bits for red, 6 bits for green, and 5 bits for blue. Using 5 bits may provide 32 possible values ($2^5=32$) of color gradients, which texture hardware may interpolate as 32 steps between 0 and 1 inclusively, i.e., an interpolation set of [0, 0.032, 0.064, 0.097, . . . , 1]. Using 6 bits may provide 64 possible values ($2^6=64$) of color gradients, which texture hardware may interpolate as 64 steps between 0 and 1 inclusively, i.e., an interpolation set of [0, 0.016, 0.032, 0.048, . . . , 1]. Therefore, in the case of RGB565, the green channel can have twice (64/32=2) the color precision as the red and blue channels.

In an alternative implementation, multiple adjacent regions or multiple nearby regions may share the same local range to further save on bits and use less memory. For example, multiple regions may use the same minimum and maximum values. Furthermore, the present concepts may use block regions that are much smaller than blocks for conventional data compression schemes. For example, the present concepts may partition a texture into blocks of 4×4 texels, 8×8 texels, or 16×16 texels that may share common minimum and maximum values. The dimensions of the block regions may be a power of 2 or they may be any other number. Using smaller dimensions for block regions requires higher number of minmax values and thus uses more memory but can result in higher quality. Therefore, the balance between quality versus memory can be conveniently controlled by varying the block dimensions. Additionally, these techniques for using regions can be applied to 3D textures, where the minmax values may correspond to 3D regions in 3D textures.

In one implementation, an example of a minmax map (or a mindelta map or a maxdelta map) for an RGB texture may include two textures—one with the minimum values and one with the deltas. These may use hardware formats (e.g., R11G11B10F or R9G9B9E5) to store 3 floating point values using only 32 bits. In an alternative implementation, instead of two textures, a linear buffer may be used with a simple mapping from 2D space to linear. One advantage of a buffer is memory coherency, and two values may be stored in adjacent memory locations in random access memory (RAM), ordinarily on the same cache line. In another implementation, a more compact form would be to store the minimum value as RGB565 and the maximum or delta as RGB565 also. This would then use 32 bits total for both values and could be stored in a single 32-bit texture or a buffer. Any other form of numerical representation is possible for the minimum, maximum, and/or delta values.

Consistent with the present concepts, various techniques may be used to encode the minimum and maximum values for the regions of a data set. The following are five example implementations consistent with the present concepts.

The first example implementation may involve locally varying absolute minmax values. Different block regions of a texture may have different minimum and maximum RGB values read from a minmax map–six values in total for a minimum R value, a minimum G value, a minimum B value, a maximum R value, a maximum G value, and a maximum B value. The minmax values may be stored as absolute values. The minmax values may be stored using any numerical encoding, including but not limited to a 32-bit float, a 16-bit float, a signed or unsigned fixed point integers, etc. Alternatively, the minimum value may be stored as an absolute value whereas the maximum value may instead be encoded as a delta in reference to the minimum value, or vice versa, where the maximum value may be stored as an absolute value and the minimum value may be encoded as a delta in reference to the maximum value. The 32 steps provided by 5 bits and the 64 steps provided by 6 bits in the RGB565 texture encoding scheme may be used to interpolate between a block region's minimum and maximum values instead of interpolating between a normalized range of [0 . . . 1].

The second example implementation may involve locally varying absolute minimum or maximum values. The second example implementation may be similar to the first example implementation described above, except that only one of either the minimum values or the maximum values may locally vary among the block regions, while the other may remain a constant for all block regions in the entire texture. Accordingly, if the absolute minimum value remains the same (e.g., the global minimum value) for all block regions, then the block regions may contain only the locally varying maximum values. The locally varying maximum values for the block regions may be stored as absolute values or as deltas (i.e., relative values) from the common global minimum value (i.e., the locally varying maximum value equals the global minimum value plus delta). Alternatively, if the absolute maximum value remains the same (e.g., the global maximum value) for all block regions, then the block regions may contain only the locally varying minimum values. The locally varying minimum values for the block regions may be stored as absolute values or as deltas (i.e., relative values) from the common global maximum value (i.e., the locally varying minimum value equals the global maximum value minus delta).

The third example implementation may involve locally varying relative minmax values. Storing an absolute minimum value and an absolute maximum value per each block for the entire texture can take up a significant amount of memory. Accordingly, the minimum and maximum values for each block can be stored as a relative value in reference to the global absolute minimum and maximum values for the entire texture. That is, the texture may have a global minimum value and a global maximum value for each of the three RGB channels. For example, a global minmax value range may be [0.5 . . . 2.0]. In this third example implementation, local minmax values for block regions may be encoded relative to the global minmax value range instead of being stored as absolute values. For instance, a local minimum value may be derived from a range inclusive of the global minimum and exclusive of either the global maximum or the local maximum (the local maximum may be delta encoded). The local maximum value may be derived from a range exclusive of the global minimum or the local minimum (the local minimum may be delta encoded) and inclusive of the global maximum.

As an illustration with more concrete example numbers, a texture may have a global minimum of 0.5 and a global maximum of 2.0 for all three RGB channels (for simplicity). Three bits may be used to encode a local minimum value for each of the RGB channels, a total of 9 bits. For encoding the local maximum values (which may be delta encoded), 2 bits may be used for the R and B channels and 3 bits may be used for the G channel, totaling 7 bits. Therefore, the total memory footprint per block region may be 16 bits (9+7=16) to encode the local minmax values for all three channels.

The three bits used for encoding the local minimum value can provide 8 possible step values ($2^3=8$). This range of possible local minimum values may be inclusive of the global minimum value but exclusive of the global maximum value. Therefore, the step size in this range may be 0.1875 ((maximum−minimum)/$2^{nBits}$=(2.0−0.5)/$2^3$=0.1875).

So, the full set of possible values for the local minimum may be derived as [0.5, 0.6875, 0.875, 1.0625, 1.25, 1.4375, 1.625, 1.8125].

The 2 bits used for delta encoding the local maximum values for each of the red and blue channels can provide 4 possible step values ($2^2=4$) for each channel. As explained above, the local maximum value may be derived from a range exclusive of the local minimum and inclusive of the global maximum. So, in this example, given a local minimum of 1.8125, the set of possible values for the local maximum value for the R and B channels may be derived as [1.859375, 1.90625, 1.953125, 2.0]. The 3 bits used for delta encoding the local maximum value for the green channel can provide 8 possible step values ($2^3=8$). The RGB color values for the block regions in the texture may then be encoded by interpolating between the local minimum value and the local maximum value.

Conventionally, without locally varying the numerical range, the 5 bits in the RGB565 scheme provide a color precision having a step size of 0.03225806452. With the present concepts, in the above example case using a local minimum and a local maximum having a range of [1.8125 ... 1.859375], the 5 bits in the RGB565 scheme can provide a color precision having a step size of 0.001512096774. Thus, this narrower range can provide a significant improvement of 21.3 times more precision for this block region of the texture compared to the conventional techniques. As illustrated, the present concepts can work in a high dynamic range (HDR) with color values greater than 1.0, which may not be possible in the original texture encoding.

The fourth example implementation may involve locally varying relative minimum or maximum values. The fourth example implementation may be similar to the third example implementation described above, except that only one of either the minimum values or the maximum values may locally vary among the block regions, while the other may remain fixed constants for all block regions in the entire texture. For example, the minimum value may be 0 or any fixed minimum value, or the maximum value may be 1, 1.5, 2, or any fixed maximum value. Accordingly, if the absolute minimum value remains the same for all block regions, then the block regions may contain only locally varying maximum values. Alternatively, if the absolute maximum value remains the same for all block regions, then the block regions may contain only locally varying minimum values.

The fifth example implementation may involve absolute values rather than relative values. In the above four example implementations, 5 or 6 bits for each of the channels in the RGB565 scheme were used to interpolate between a minimum value and a maximum value. In this fifth example implementation, a local minimum value may be derived, and then the data values in the texture may be treated as an absolute value, e.g., 5 bits can provide 32 steps in a range of [0 ... 31], that can then be added to the minimum value to provide the final result. Or alternatively, the value can be subtracted from a maximum value to provide the final result. There may be no interpolation between a minimum value and a maximum value.

The five example implementations described above improve upon conventional data compression techniques by using fewer bits to encode the same amount of information or using the same number of bits to encode data with higher fidelity, or a combination of both. Of the five example implementations described above, the third example implementation may be the most efficient in terms of storage space with the block regions using a low number of bits, especially when using delta encoding.

The present concepts applied to the texture context can enable substantial memory savings and/or significant improvement in image quality for the existing texture compression schemes. For example, much higher fidelity can be achieved by using the limited number of bits in each compressed block to encode an interpolation value used to interpolate within a local range rather than encoding an absolute value within a global range for the entire texture. That is, the number of bits that are typically used in conventional compression schemes to store absolute RGB values can be repurposed to encode color as interpolation values within relatively smaller local ranges to provide more precision and higher image quality using the same number of bits or even fewer number of bits. To illustrate, 5 bits may be used in a conventional compression scheme to encode the red color value as one of 32 steps ($2^5=32$) within a global range for a texture between [0 ... 1]. With the present concepts, those 5 bits may instead be used to encode the red color value as one of 32 steps within a locally varying range for a particular block between, for example, [0.5 ... 0.75], thus providing quadruple the fidelity.

Furthermore, dynamic allocation of the number of bits used to encode data for each channel per local region may permit a more intelligent compression scheme with improved quality. Conventional data compression schemes are typically applied uniformly to all areas of a texture. However, using the present concepts, each region can be compressed differently using varying local ranges and using different bit allocations. These improvements in image quality may allow applications to choose more aggressive texture compression schemes (e.g., adaptive scalable texture compression ("ASTC") instead of block compression (BCn)), thus saving memory.

The present concepts can provide another benefit of allowing certain textures, which were not intended to store high dynamic range ("HDR") or wide gamut data, out of its normal numerical range (e.g., from 0 for black to 1 for paper white) to now operate outside of their originally intended ranges. These ranges can be, for example, HDR or wide gamut. This is due to the bits now being used as interpolation values within local ranges rather than absolute values.

Although the present concepts have been described above using the RGB color encoding scheme as an example application, the present concepts can be applied to compressing any forms of data in any format. That is, other attributes associated with pixels in a texture may be compressed using the present concepts. For example, the color for each pixel may be encoded using other color models besides RGB, such as HSL (hue, saturation, lightness), HSV (hue, saturation, value), HSB (hue, saturation, brightness), or CMYK (cyan, magenta, yellow, key/black), among others. Moreover, the present concepts can encode other types of texture data besides color, such as normal maps, roughness maps, cube maps, or any data held in a texture map, with any number of channels and any number of dimensions. Such data can also be compressed using locally varying numerical ranges.

Another example will be described for using the present concepts to encode a single-channel texture that stores luminance values associated with pixels in the texture. For example, the texture may have a global minimum luminance value of 0.1 and a global maximum luminance value of 1.3. In this example, each block (e.g., 4×4 pixel tile) may use 4 bits to store a relative local minimum luminance value and use 4 bits to store a relative local delta maximum luminance value. That is, the local minimum luminance value may be encoded relative to the global minimum luminance value, rather than being encoded as an absolute value. Furthermore, the local maximum luminance value may be encoded as a delta value relative to the local minimum luminance value. The 4 bits allocated for encoding the local minimum may provide 16 steps ($2^4$=16) within the global range of [0.1 . . . 1.3]. The 4 bits allocated for encoding the local maximum may provide 16 steps between the local minimum and the global maximum. Below are example formulas for encoding and decoding local minimum and maximum values.

$$VL_{Min} = \frac{EL_{Min}}{2^{nBits}} \times (G_{Max} - G_{Min}) + G_{Min}$$

$$VL_{Max} = \frac{EL_{Max} + 1}{2^{nBits}} \times (G_{Max} - VL_{Min}) + VL_{Min}$$

In the above formulas, $G_{Min}$ may be the global minimum value, $G_{Max}$ may be the global maximum value, $VL_{Min}$ may be the local minimum value, $VL_{Max}$ may be the local maximum value, $EL_{Min}$ may be the local minimum encoded value, $EL_{Max}$ may be the local maximum encoded value, and nBits may be the number of bits allocated for encoding.

For instance, suppose a particular tile stores an encoded value of 9 for the local minimum and an encoded value of 3 for the local delta maximum. These example encodings represent a tile local minimum value of 0.775 ($9/2^4 \times (1.3-0.1)+0.1=0.775$) and a title local maximum value of 0.90525 (($3+1)/2^4 \times (1.3-0.775)+0.775=0.90525$), using the above formulas. Accordingly, in this example, the particular tile may have a local luminance range of [0.775 . . . 0.90525]. This local range can be encoded using 8 bits (4 bits for the minimum plus 4 bits for the maximum).

The luminance values for each pixel in the 4×4 tile may thus be encoded as interpolation values in reference to the local minimum value of 0.775 and fall within the local range. Therefore, the luminance values of all pixels in this tile may be decoded as interpolation values that interpolate between the local minimum of 0.775 and the local maximum of 0.90525. The number of bits used to encode the luminance value for each pixel may determine the number of steps provided within this local range and thus affect the level of luminance precision.

The present concepts can also be applied to mipmaps. The data set to be compressed may include texture mipmaps. Mipmaps may store multiple versions of the same image, each version being progressively lower resolution and smaller size by power of two. For example, each 2×2 block in a texture mipmap may be averaged to generate a 1×1 pixel in the next lower-resolution mipmap. Therefore, the local range (i.e., the same minimum value and maximum value) may be shared among multiple levels of a mipmap chain.

Figure 4:
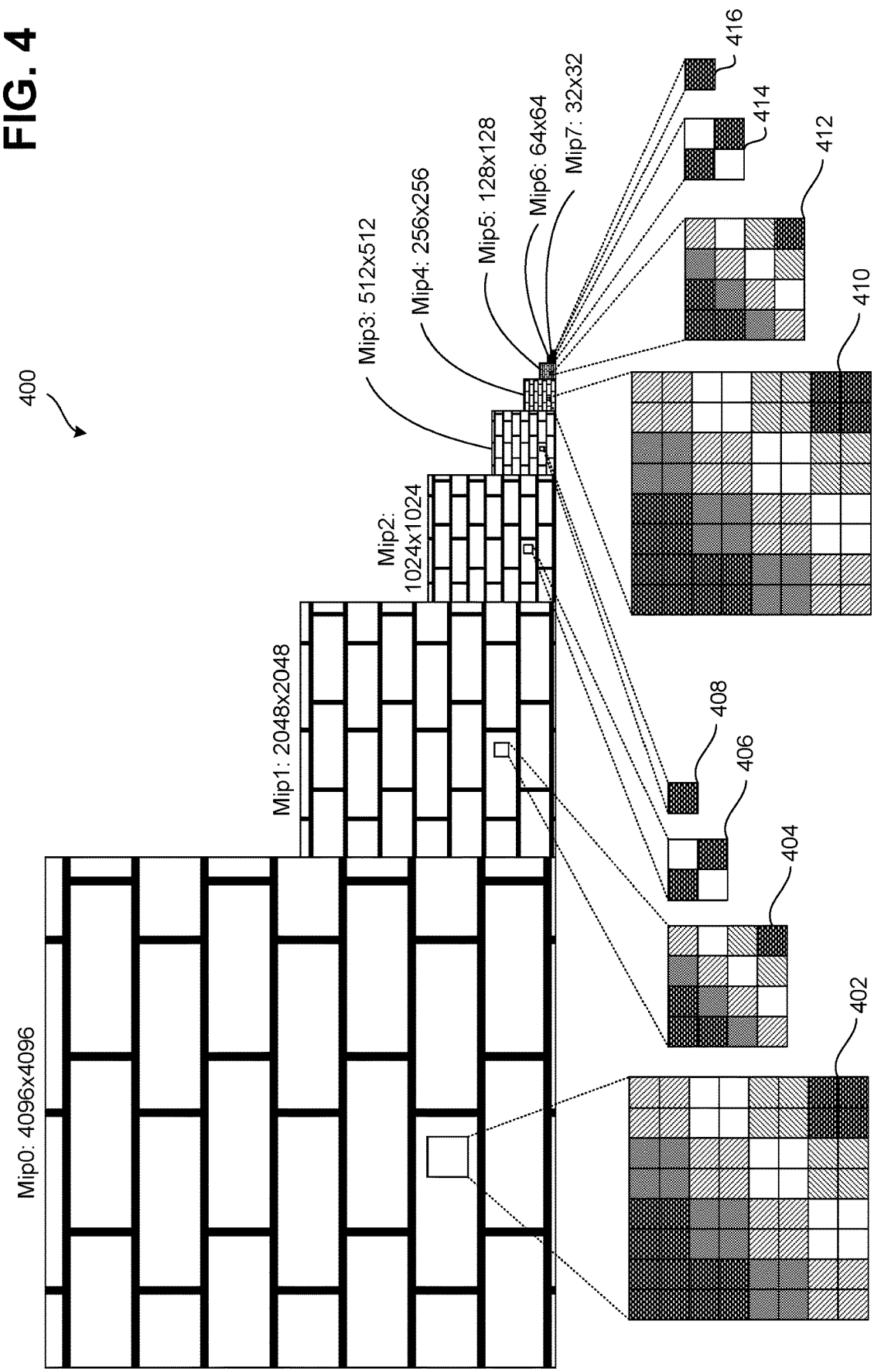
FIG. 4 illustrates example mipmaps, consistent with the present concepts.

FIG. 4 illustrates example mipmaps 400, consistent with the present concepts. In this example, the largest mipmap (Mip0) may have a size of 4,096×4,096 pixels. Mip0 may be partitioned into a plurality of blocks 402 having 8×8 texels. The next level mipmap (Mip1) may have a size of 2,048×2,048 pixels and may be partitioned into a plurality of blocks 404 having 4×4 texels. As mentioned above with respect to FIG. 1, FIG. 4 shows mipmaps having brick textures, but any other images are possible. Also, other dimensions, shapes, and resolutions for the mipmaps and for the blocks are possible.

Consistent with the present concepts, the local range determined for a particular 8×8 block in Mip0 may be reused as the local range for the corresponding 4×4 block in Mip1. That is, a single local range having a local minimum value and a local maximum value may be determined and used by the 8×8 block 402 in Mip0, also used by the corresponding 4×4 block 404 in Mip1, also used by the corresponding 2×2 block 406 in Mip2, and also used by the corresponding 1×1 block 408 in Mip3. If there are more levels of mipmaps in the chain (as is the case illustrated in FIG. 4), the block size may start over from an 8×8 size (or any other size) with a new local range. That is, a new local range may be determined and used by the 8×8 block 410 in Mip4, the corresponding 4×4 block 412 in Mip5, the corresponding 2×2 block 414 in Mip6, the corresponding 1×1 block 416 in Mip7, and so on. Therefore, the number of different local ranges that may need to be stored can be cut down by log base 2 (also called binary logarithm) of the mipmap tile size.

Because a block in the subsequent smaller mipmap (e.g., the block 404) typically stores average colors of the corresponding block in the previous larger mipmap (e.g., the block 402), the smaller block does not need a larger local numerical range than the corresponding larger block in the preceding mipmap. Accordingly, the local range, defined by a minimum value and a maximum value, used by the larger, higher-resolution block can also be reused for the corresponding smaller, lower-resolution block in the subsequent mipmap. Therefore, each numerical range may be used by multiple corresponding blocks in multiple levels of mipmaps. This technique can enable considerable memory savings for the numerical range texture while at the same time improving the cache hit performance.

The present concepts therefore enable substantial memory space savings by having multiple corresponding texel blocks at different mipmap levels share the same minimum and maximum values for the common local ranges. This mapping of one local range to multiple texel blocks through a mip chain may allow the minmax texture to be very much smaller than the RGB texture. And smaller regions can provide higher precision and fidelity with fewer bits.

The improvements in image quality as well as memory savings may allow applications to avoid packing a higher-resolution top-level mipmap. The additional higher resolutions may be unnecessary due to the higher image quality, smaller package size, lower RAM requirements, less bandwidth usage, etc. Moreover, the present concepts may bias mipmaps to have increased image quality and hence higher levels of detail, such that lower-resolution mipmaps can be selected for display, thus increasing performance and decreasing rendering time.

Figure 5:
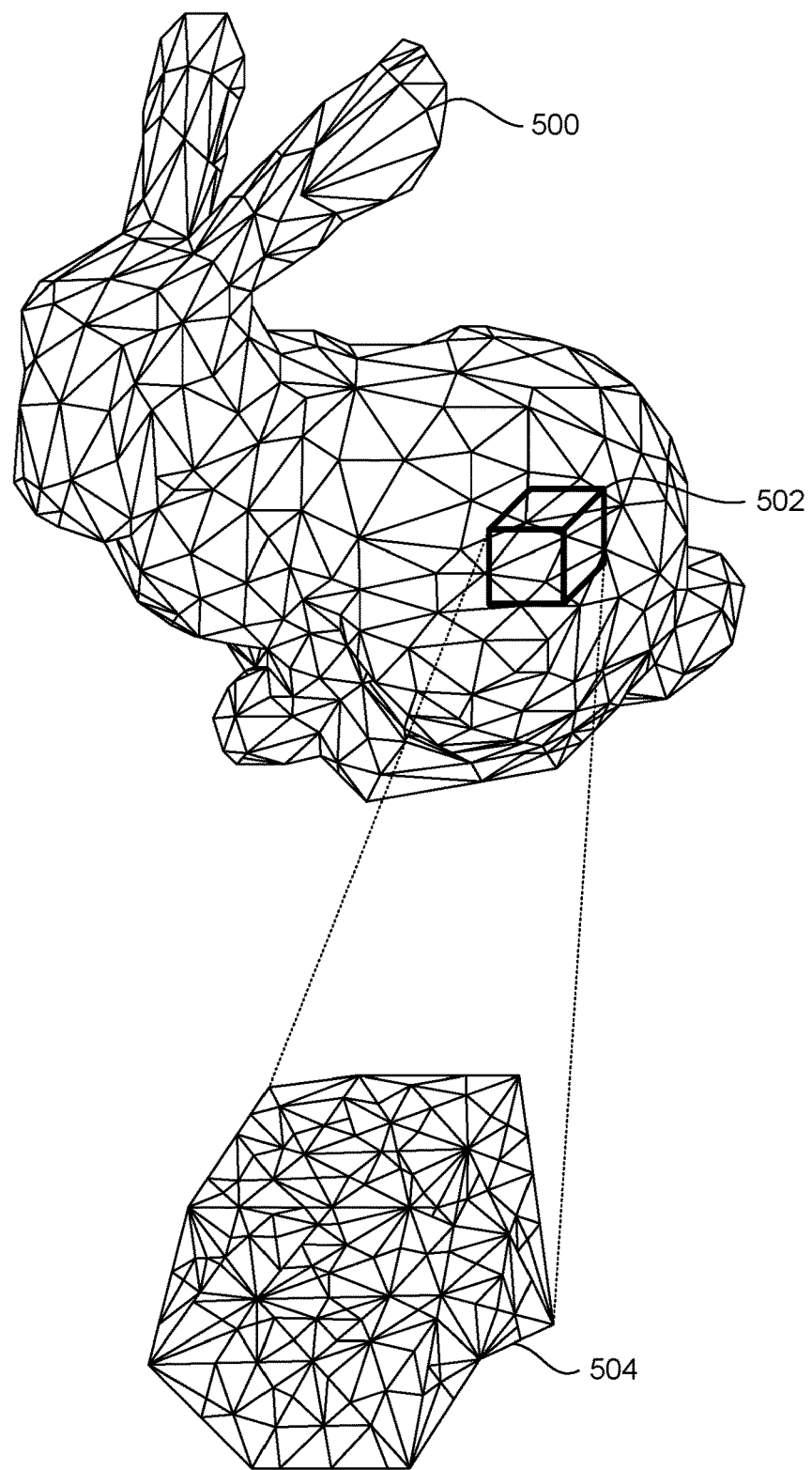
FIG. 5 illustrates an example 3D polygon mesh, consistent with the present concepts.

The present concepts can be applied to geometry data, including 2D and 3D geometry. FIG. 5 illustrates an example 3D polygon mesh 500, consistent with the present concepts. The mesh 500 may include vertices, edges connecting the vertices, and surfaces defined by the vertices and edges. For instance, the mesh 500 may include a vertex buffer that stores a list of all the vertices in the mesh 500 and a triangle buffer that stores a list of triangles formed by a set of three vertices. The example in FIG. 5 includes the mesh 500 of a rabbit, but the present concepts can be applied to any kind of mesh. Furthermore, the mesh 500 uses triangles (called a triangular mesh) but the present concepts may use a mesh comprising quadrilaterals, any other polygon, or a mix of different types of polygons. The data set to be compressed, in this example, may include the 3D coordinate positions of the vertices.

For instance, the 3D polygon mesh 500 may be partitioned into multiple 3D regions (e.g., boxes 502) that define a plurality of meshlets 504 inside the regions. In one implementation, the mesh 500 may be partitioned into regions containing 256 triangles. Each partition need not be the same shape or the same size, or contain the same number of vertices or triangles. That is, partitioning the 3D mesh 500 into a plurality of same-sized boxes 502 may be one optional implementation. In alternative implementations, the mesh 500 may be partitioned using different shapes, irregular shapes, different-sized partitions, etc. Moreover, the mesh 500 may be partitioned based on logical divisions. For example, the mesh 500 may be partitioned into a region for each ear, a region for the head, a region for the body, a region for each leg, a region for the tail, and so on. In other scenarios, a mesh representing a human figure may be partitioned by body parts, for example, a region for a hand, a region for an arm, a region for the head, and so on; and a mesh representing a teapot may be partitioned by its components, for example, a region for the body, a region for the handle, a region for the lid, a region for the spout, and so on.

For each meshlet region, a local numerical range may be determined for each channel (the XYZ axes in this example). That is, by analyzing the positions of all vertices in a meshlet region, a local minimum X value, a local maximum X value, a local minimum Y value, a local maximum Y value, a local minimum Z value, and a local maximum Z value may be determined to define the local minmax ranges for this particular meshlet region.

Then, a number of bits may be used to encode the positions of the vertices. Rather than using a high number of bits by encoding the XYZ position coordinates as absolute position values in the 3D space (e.g., [2394879827984.387, −902837.5612028120, −82364739292.1830219]), the position coordinates may be stored as relative interpolation values in reference to the local minimum values using a smaller number of bits. That is, the positions of the vertices may be stored as interpolation values that interpolate between the local minimum position value and the local maximum position value. The position coordinate values may represent figures in pixels, meters, inches, or any other units being used by the applicable coordinate system.

In this example application of the present concepts, the position data for the vertices in a meshlet region may be within a local range between a local minimum X value, a local maximum X value, a local minimum Y value, a local maximum Y value, a local minimum Z value, and a local maximum Z value. Thus, the local range can conceptually form a 3D box that is bound by the local minmax extents.

Figure 6:
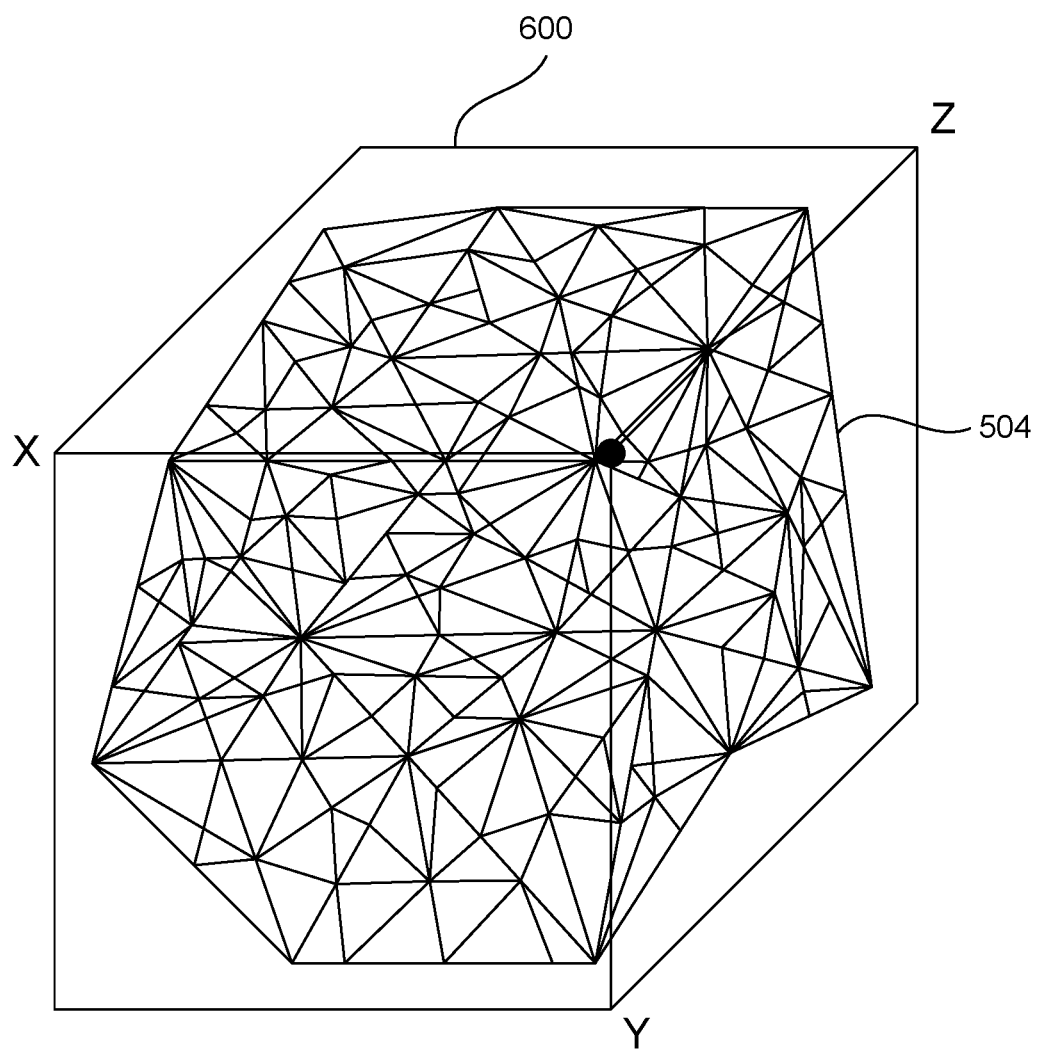
FIG. 6 illustrates a conceptual 3D box of local numerical ranges of vertex position, consistent with the present concepts.

FIG. 6 illustrates a conceptual 3D box 600 of local numerical ranges of vertex position, consistent with the present concepts. FIG. 6 shows the local X range bounded by the local minimum X value and the local maximum X value, the local Y range bounded by the local minimum Y value and the local maximum Y value, and the local Z range bounded by the local minimum Z value and the local maximum Z value. FIG. 6 also shows the meshlet 504 whose vertices are positioned within a region (e.g., the box 502) and whose vertex positions are bound within the local ranges.

Figure 7:
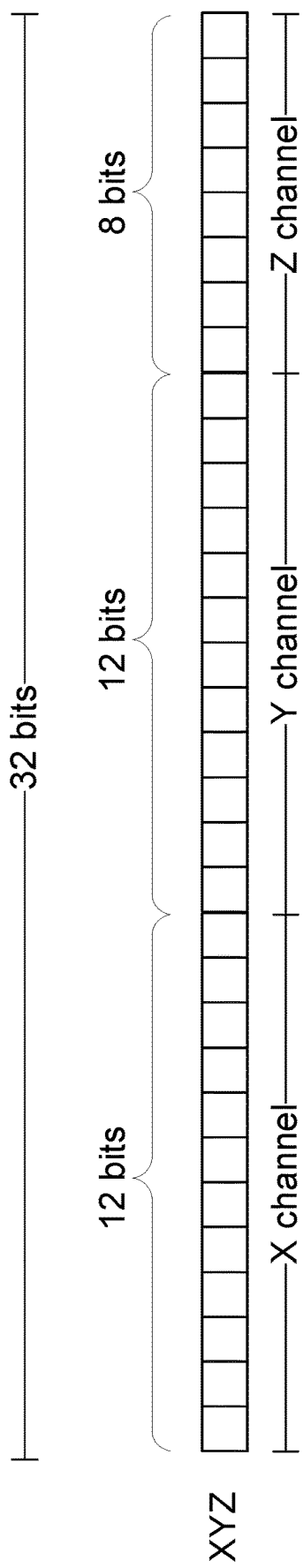
FIG. 7 illustrates an example bit allocation for a vertex position encoding scheme, consistent with the present concepts.

FIG. 7 illustrates an example bit allocation for a vertex position encoding scheme, consistent with the present concepts. Consistent with the present concepts, the number of bits used to encode each of the X, Y, and Z components of the vertex position data may be dynamically allocated per meshlet. In one example implementation, the relative lengths of local ranges along the X, Y, and Z axes can be used to decide how many bits to allocate to each of the X, Y, and Z channels. In another implementation, fewer bits may be allocated to the Z axis relative to the X and Y axes, where the Z axis runs along the depth axis of a 2D view screen. Therefore, less precision may be required along the Z axis, because variations in spatial position are less perceivable by a user along the depth axis when viewing through a 2D view screen. For example, if 32 bits are available to encode the entire XYZ position data for a vertex, 12 bits may be allocated for each of the X and Y components and 8 bits may be allocated for the Z component, where the local Z axis range is shorter than the local X axis range and the local Y axis range. Using 8 bits to encode the Z position value can provide 256 steps ($2^8$=256) of precision between the local minimum Z value and the local maximum Z value, whereas using 12 bits to encode each of the X and Y position values can provide 4,096 steps ($2^{12}$=4,096) of precision between the respective local minmax values in the X and Y axes. Other bit allocation distributions may be used depending on the relative degrees of variance (e.g., the relative lengths of the local ranges) for the three axes. For example, if a particular channel has relatively small or zero variance in data values, a relatively few or zero bits may be allocated to that particular channel. Although the present concepts have been described with respect to vertex position data having three channels, the present concepts may be applied to other vertex attributes that may have one or more channels of data.

In some implementations, less than all vertices may be compressed using locally varying numerical ranges. Because data compression can result in loss of data (or inexact precision), it may be desirable in certain scenarios to maintain high precision and avoid loss of data by foregoing the data compression techniques described above. One example of such a scenario will be described below.

For a given mesh of vertices, some vertices may be included in only one meshlet while other vertices may be included in multiple meshlets (or reside at a juncture or boundary between multiple meshlets). For example, a vertex on an outer edge of a meshlet may be located on a border between two meshlets, whereas a vertex located in an inner area of a meshlet may not be shared with any other meshlets. In one implementation, a set of vertices that is included in only one meshlet may be compressed using local numerical ranges, whereas the other vertices that are included in more than one meshlet may not be compressed using the techniques described above. Encoding the vertices that are shared among multiple meshlets (i.e., the vertices on the boundaries between multiple meshlets) using approximate interpolation values based on discrete step-wise precision could result in disjoined boundaries between meshlets and therefore create gaps in the polygon mesh due to the loss in precision. Such gaps or disjoined boundaries in the mesh would be undesirable in certain scenarios.

Accordingly, the vertices that are referenced by one meshlet may be separated from the vertices that are references by multiple meshlets. In one implementation, a meshlet may include two sets of vertices, the first set of vertices that may not be compressed, whereas the second set of vertices may be locally compressed using the techniques described above. In another implementation, the first set of vertices for all meshlets may be encoded using a common global range (i.e., a global minimum and a global maximum), such that all vertices in the first sets for all meshlets would be encoded using the same set of step-wise interpolation values in the same global range, thus avoiding disjoined meshlet boundaries or any gaps in the mesh.

The present concepts applied to geometry data can enable higher levels of compression than were practicable with conventional methods in the past. For example, if 16 bits are used conventionally to store the position data for each of the X, Y, and Z channels, a total of 48 bits would be required for all three channels. However, the present concepts can use 32 bits to store position data for all three channels. In particular, there are big advantages in memory savings and processing time by packing 3-component vectors into a single 4-byte read (4 bytes equal 32 bits). This level of compression has conventionally been considered too aggressive in the past, such that many game developers opted for 6 bytes instead (6 bytes equal 48 bits). The present concepts of using locally varying numerical ranges that permit textures to obtain a higher image quality, as described above, can thus also be applied to squeeze 3 vector components into 4 bytes in geometry applications.

Although the present concepts have been described above using vertex position coordinates as an example application, the present concepts can be applied to compressing any forms of data in any format. That is, other attributes associated with vertices in a mesh may be compressed using the present concepts. The mesh may store other vertex attributes (e.g., normals, UV coordinates, etc.) that can be encoded using local numerical ranges.

Furthermore, the vertex buffer and/or the triangle buffer may be encoded using the present concepts. For example, rather than encoding the vertex identifications ("IDs") using absolute values, the vertex IDs may be stored as deltas from the minimum value using a fewer number of bits. No interpolation technique is necessary when encoding numerical IDs that are simply used as counters. For example, if a first meshlet region has 256 triangles formed by vertex ID 0 through vertex ID 200, and a second meshlet region has 256 triangles formed by vertex ID 180 through vertex 350, the local minimum value for the vertex ID in the second meshlet region may be 180, and all the vertices in the second meshlet region may be given a delta value for their IDs to save on bits. That is, vertex ID 180 may store 0 as its ID, vertex ID 181 may store 1 as its ID, vertex ID 182 may store 2 as its ID, and so on, until vertex ID 350 may store 170 as its ID. Although this basic example uses low digit numbers for simplicity, a substantial number of bits can be saved for a large and complicated mesh containing millions of vertices and triangles by storing vertex IDs as delta values rather than as absolute values. A demonstration of a working example implementation of the present concepts applied to the 3D mesh context can be viewed on YouTube (https://www.youtube.com/watch?v=0sJ_g-aWriQ). This demonstration applied the present concepts to the vertex indices by storing a local minimum vertex ID for a region of triangles and adding offset values encoded using a reduced number of bits to arrive at the final three vertex ID values for each triangle.

The present concepts described here can be applied to virtually any forms of data that can benefit from compression to save memory space and can tolerate certain level of loss (i.e., lossy compression). Any data having some exploitable uniformity where there are segments, areas, or volumes with different or varying local ranges that are smaller than the global range can result in saved bits by breaking up the data set into discrete chunks and storing deltas rather than absolute values.

For example, sound data may be compressed using the present concepts. A data set including sound information may include multiple channels of data, such as amplitude, frequency, etc. The sound data set may be broken up into a plurality of time regions (e.g., tenth-second intervals depending on the sampling rate). Local ranges (i.e., local minimum extents and local maximum extents) may be determined for the multiple channels of data. Then, the sound data values may be encoded as interpolation values in reference to the local minimum extents rather than being encoded as absolute values. As another example, the present concepts can be applied to videos, which are essentially a collection of images and sounds.

Furthermore, any graphical data, such as a seismograph, may benefit from the present concepts. Rather than using a high number of bits by storing an absolute value for each data point along the graph, a lower number of bits may be used by breaking up the graph into discrete chunks (e.g., x-axis intervals), determining the local range of data values (e.g., y-axis values) within a discrete chunk, and storing the data values as interpolation values in reference to the local minimum value rather than as absolute y-axis values.

Consistent with the present concepts, the numerical ranges and data values may be stored in any appropriate, available, and/or convenient form. For example, numerical ranges and data values may be stored using a signed or unsigned minimum value and an unsigned delta value. It is also possible to use other conventions or schemes. For example, a range may be defined by a minimum and a maximum or defined by a center and a half size. Data values may be encoded using an unsigned delta above the minimum or below the maximum, or using a signed delta above or below the center. Various implementations are possible.

Consistent with the present concepts, compression may be performed by software. Decompressing data that has been compressed using the present concepts can be performed quickly and may involve simple computations. In the case of encoding using a minimum value and interpolation values, decompression may entail a single multiply-add operation to each locally compressed component as it is read from memory. That is, the interpolation value and the step size may be multiplied and then added to the minimum.

In the texture application, decompression may be performed by hardware at a per sample level before blending and color operations (e.g., gamma correction). For instance, existing decompression capabilities in GPUs can be used to take the output and scale it between a region's local minimum and local maximum. In the scenario of a completely flat region of texture, all texture channels may have zero deltas, in which case the GPU may not need to read the high-resolution data.

In the geometry application, the time to perform decompression may be faster. Decompression for geometry may involve a single scalar read of the local extents per component per meshlet, whereas decompression for texture may involve the higher cost of a dependent read, albeit of a relatively small-sized and local range data. Decompression for geometry can be performed by hardware or software. For example, when using an input assembler for mesh processing, decompression may be performed by hardware, or the data may be passed to a vertex shader or mesh shader to perform decompression in software, either by user code or code inserted by a shader compiler.

The present concepts provide many advantages. The data encoding techniques may permit higher quality compressed textures, which can result in overall savings in package size, faster load times, and reduced memory and bandwidth requirements due to applications using a more aggressive compression scheme and/or a smaller texture. For geometry, the present concepts may enable reduced package sizes, faster load times, and reduced memory and bandwidth use.

Figure 8:
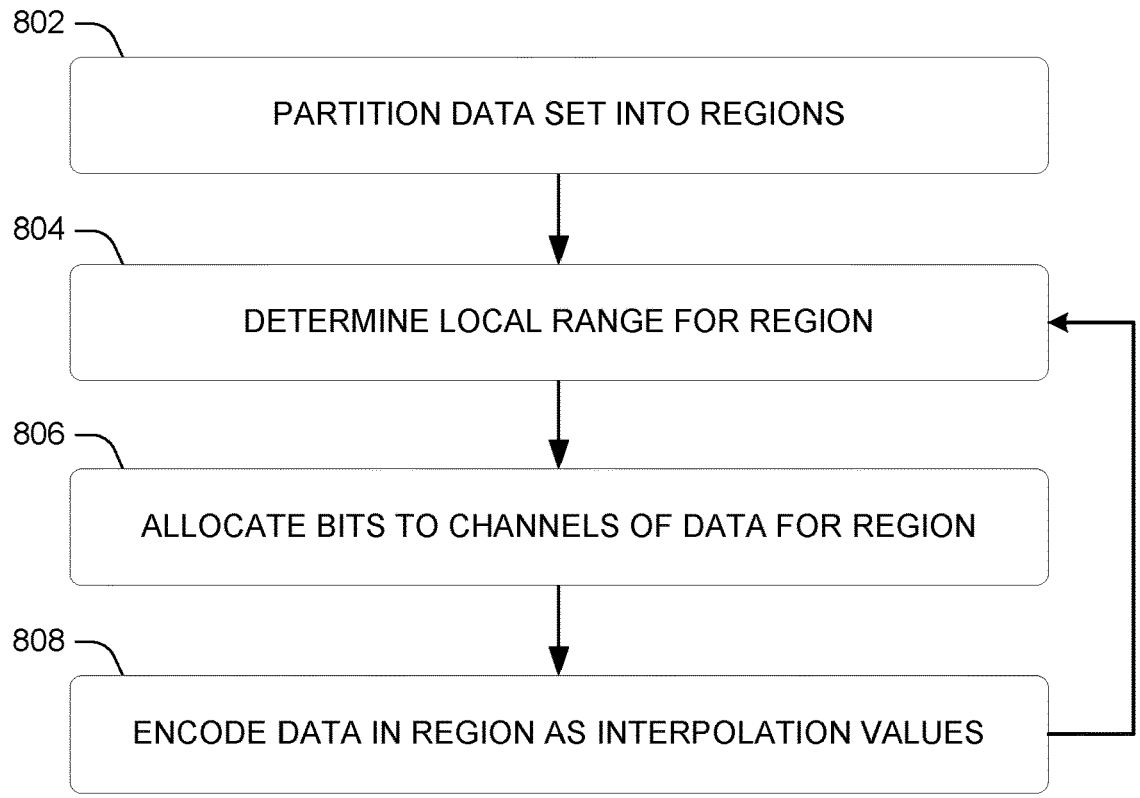
FIG. 8. illustrates a flow chart of an example data compression method, consistent with the present concepts.

FIG. 8. illustrates a flow chart of an example data compression method 800, consistent with the present concepts. This example data compression method 800 is presented for illustration purposes and is not meant to be exhaustive or limiting. The acts in the data compression method 800 may be performed in the order presented, in a different order, or in parallel or simultaneously, or may be omitted. In some implementations, the data compression method 800 may be performed when a data set is being packaged rather than, for example, at runtime when the data set is being rendered.

In act 802, a data set may be partitioned into a plurality of regions. The size, shape, scope, and/or dimensions of the regions may be selected based on one or more factors. For example, when partitioning a texture into blocks of texels, the size of each block may be selected to be small enough such that the variance in color data within the block is small, and thus the local range is significantly smaller than the global range, such that encoding the color data as interpolation values requires fewer bits compared to encoding the color data as absolute values. Furthermore, the size of each block should be small enough so that even a few bits can provide satisfactory levels of color precision and fidelity. However, selecting the size of each block too small may lead to a very high number of blocks, which requires storing a higher number of local ranges, thus using more memory. Therefore, there may be a trade-off balancing when selecting the size of the blocks.

In act 804, a local range may be determined for a particular region. This act may involve evaluating the data within the particular region and identifying the smallest data value as the local minimum and identifying the largest data value as the local maximum. For example, when determining a local range for a meshlet, the X, Y, and Z position coordinates of all vertices in the meshlet may be checked to identify the local minimum X value, the local maximum X value, the local minimum Y value, the local maximum Y value, the local minimum Z value, and the local maximum Z value. The local minimum and/or maximum values may be encoded as absolute values or relative values in reference to a global minimum and/or a global maximum.

In act 806, a number of available bits may be allocated to a plurality of channels of data based on, for example, the relative degrees of variance of data among the plurality of channels. The desired levels of the precision and quality may also determine the bit distribution among the plurality of channels. In one implementation, a higher number of bits may be allocated to a channel that has a relatively higher degree of variance in data, whereas a lower number of bits may be allocated to a channel that as a relatively lower degree of variance in data. In some cases, zero bits may be allocated to a channel that does not have any variance in data.

In act 808, data in the particular region may be encoded as interpolation values within the local range. The data in a particular channel may be encoded using the number of bits allocated to that channel in act 806. For example, in the 3D mesh context, rather than encoding a vertex position as absolute values, the vertex position may be encoded as interpolation values in reference to local extents using fewer bits. The acts 804 to 808 may be repeated for all or some of the regions, or all of some of the data points (e.g., texels or vertices).

FIG. 9 illustrates an example computer 900 for data compression, consistent with the present concepts. The computer 900 may execute all or a part of the data compression method 800. The computer 900 may be any system that includes processing capability and storage capability to be able to execute instructions, for example, a server, mainframe computer, workstation, desktop personal computer ("PC"), laptop, notebook, tablet, smartphone, video game console, appliance, kiosk, automobile navigation or entertainment system, virtual reality simulator, minicomputer, hand-held device, wearable, programmable electronics, etc. Although only one computer 900 is illustrated in FIG. 9, the computer 900 may include several computers, for example, in a data center or connected via a network and/or provided by a cloud computing service.

The term "device," "computer," or "computing device" as used herein can mean any type of device that has some amount of processing capability and/or storage capability. Processing capability can be provided by one or more hardware processors that can execute data in the form of computer-readable instructions to provide a functionality.

The computer 900 may include a CPU 902 for executing instructions, for example, machine-executable instructions that implement various aspects of the present concepts described herein. Although only one CPU 902 is shown in FIG. 9 for simplicity, the computer 900 may include multiple CPUs. The CPU 902 may be a single processor, a multi-processor, single-core units, and/or multi-core units. The CPU 902 may perform processing to implement the present concepts, including all or part of the data compression method 800.

The computer 900 may include storage 904 for storing data, including programs, applications, operating systems, and other machine-executable instructions. The storage 904 may include computer readable storage media, such as magnetic disks, optical disks, solid state drives, removable memory, external memory, and/or flash memory, etc. Computer readable storage media can be any available media for storing information without employing transitory propagated signals. The storage 904 may store instructions and/or data (e.g., textures, mipmaps, meshes, audio files, etc.) for implementing the present concepts, including all or a part of the data compression method 800.

The computer 900 may include random access memory (RAM) 906 for loading active data, programs, applications, operating systems, and/or other machine executable instructions from the storage 904. The RAM 906 may be volatile and/or non-volatile memory. The RAM 906 may be used by the CPU 902 to load, access, and manipulate instructions and/or data for implementing the present concepts.

Data, such as computer-readable instructions and/or user-related data, can be stored on the storage 904, which can be internal or external to the computer 900. The storage can include any one or more of volatile or non-volatile memory, hard drives, flash storage devices, optical storage devices (e.g., CDs, DVDs etc.), and/or remote storage (e.g., cloud-based storage), among others.

The computer 900 may include network interfaces 908 for interfacing with one or more networks to communicate with other computers or devices (e.g., networked storage, networked display, etc.). The network interfaces 908 can include wired network interfaces for connecting to wired networks (e.g., ethernet), and can also include wireless network interfaces for connecting to wireless networks (e.g., Wi-Fi, Bluetooth, cellular, etc.). In some implementations, the computer 900 may communicate with other computers using the network interfaces 908 to implement all or part of the present concepts in a distributed manner.

The computer 900 may include a graphics processing unit (GPU) 910 for executing instructions related to graphics and for displaying graphics on a display screen. The GPU 910 may reside on a graphics card that is connected to an on-board display or an external display, and may include an interface for sending video signals to the display. The graphics card may also include graphics memory for storing instructions and/or data related to graphics. Although FIG. 9 illustrates the GPU 910 and the CPU 902 separately, the GPU 910 may be an integrated GPU that is on the same die as the CPU 902, for example, in a system on a chip (SoC). Although FIG. 9 illustrates only one GPU 910, the computer 900 may include multiple GPUs. The GPU 910 may be a single processor, a multi-processor, single-core units, and/or multi-core units. The GPU 910 may implement the present concepts, including all or a part of the data compression method 800. For example, the graphics memory on the graphics card may store textures, mipmaps, or meshes, consistent with the present concepts. The GPU 910 and the CPU 902 may communicate with each other and work together to implement the present concepts.

The computer 900 may include input/output ("I/O") device interfaces 912 for interfacing with one or more I/O devices, such as a keyboard, mouse, track pad, speaker, microphone, printer, scanner, facsimile machine, camera, remote control, joystick, game pad, stylus, touch screen, etc. A user or a device may provide input to the computer 900 using one or more of these input devices and receive output from the computer 900 using one or more of these output devices.

The computer 900 may include a bus 914 that connects various components of the computer 900 and provides an interface for those components to communicate and transfer data among one another. The bus 914 may also connect to other buses inside the components, such as a memory bus inside the RAM 906, and/or connect to external peripheral buses for interfacing with external peripherals, such as peripheral component interconnect ("PCI") components. For example, the I/O device interfaces 912 may include a parallel port, a serial port, a game port, a universal serial bus ("USB") port, etc.

The computer 900 illustrated in FIG. 9 is merely one example. Many other configurations of the computer 900 are possible. The number and the types of components in the computer 900 can vary. Multiple computers can be used together.

FIG. 9 shows two example computer configurations 916(1) and 916(2) that can be employed by the computer 900. The computer 900 can employ either of the configurations 916(1) or 916(2), or an alternate configuration. One instance of each configuration 916 is illustrated in FIG. 9. The configuration 916(1) may represent an operating system ("OS") centric configuration. The configuration 916(2) may represent a system on chip ("SoC") configuration. The configuration 916(1) can be organized into one or more applications 918, operating system 920, and hardware 922. The configuration 916(2) may be organized into shared resources 924, dedicated resources 926, and an interface 928 therebetween. In either configuration 916, the computer 900 can include a storage 930 and a processor 932. The computer 900 can also include a data compression module 934 for executing the present concepts.

As mentioned above, the configuration 916(2) can be thought of as a SoC type design. In such a case, functionality provided by the computer 900 can be integrated on a single SoC or multiple coupled SoCs. One or more processors 932 can be configured to coordinate with shared resources 924, such as the storage 930, etc., and/or one or more dedicated resources 926, such as hardware blocks configured to perform certain specific functionalities. Thus, the term "processor" as used herein can also refer to central processing units (CPUs), graphical processing units (GPUs), controllers, microcontrollers, processor cores, or other types of processing devices.

Generally, any of the functions described herein can be implemented using software, firmware, hardware (e.g., fixed-logic circuitry), or a combination of these implementations. The term "component" or "module" as used herein generally may represent software, firmware, hardware, whole devices or networks, or a combination thereof. In the case of a software implementation, for instance, these may represent program code that performs specified tasks when executed on a processor (e.g., CPU or GPU). The program code can be stored in one or more computer-readable memory devices, such as computer-readable storage media. The features and techniques of the component or module may be platform-independent, meaning that they may be implemented on a variety of commercial computing platforms having a variety of processing configurations.

Various examples have been described above. Although the subject matter has been described in language specific to example structural features and/or methodological acts, the subject matter defined in the appended claims is not necessarily limited to the specific features or acts described above. Rather, the specific features and acts described above are presented as example forms of implementing the claims, and other features and acts that would be recognized by one skilled in the art are intended to be within the scope of the claims.

Various examples are described above. Additional examples are described below. One example includes a system comprising a processor and a storage storing instructions which, executed by the processor, cause the processor to partition a data set into regions, generate a minmax map for the data set, and for a particular region determining a local range for the particular region, the local range including a local minimum and a local maximum, store the local minimum and the local maximum for the particular region in the minmax map, determine a number of bits available to encode data in the particular region, calculate a step size based on the number of bits, the local minimum, and the local maximum, and encoding the data in the particular region using the number of bits as an interpolation value within the local range based on the step size and in reference to the local minimum or the local maximum.

Another example can include any of the above and/or below examples where the data set includes a mesh, and the particular region includes a meshlet.

Another example can include any of the above and/or below examples where the data represents a vertex position and/or vertex attributes.

Another example can include any of the above and/or below examples where the particular region includes data for a plurality of axes, the instructions further causing the processor to allocate the number of bits among the plurality of axes based on relative variances of the data among the plurality of axes in the particular region.

Another example can include any of the above and/or below examples where the particular region includes data for a plurality of axes, the instructions further causing the processor to for the particular region, determine a plurality of local ranges corresponding to the plurality of axes.

Another example can include any of the above and/or below examples where one of the local minimum or the local maximum for the particular region is encoded as a delta in the minmax map.

Another example can include any of the above and/or below examples where the instructions further cause the processor to determining a global range for the data set, the global range including a global minimum and a global maximum and encoding the local minimum for the particular region as a relative value in reference to the global minimum.

Another example can include any of the above and/or below examples where the data represents a position of a vertex, the instructions further causing the processor to determine that the vertex is included in more than one region and encode the data for the vertex as an interpolation value in reference to the global minimum or the global maximum.

Another example includes a method comprising partitioning a data set into regions and for a particular region determining a local range for the particular region, the local range including a local minimum and a local maximum and encoding data in the particular region as an interpolation value within the local range.

Another example can include any of the above and/or below examples where the data set includes a texture, and the particular region includes a block of texels in the texture.

Another example can include any of the above and/or below examples where the data represents color.

Another example can include any of the above and/or below examples where the particular region includes data for a plurality of channels, the method further comprising allocating bits among the plurality of channels based on relative variances of the data among the plurality of channels for the particular region.

Another example can include any of the above and/or below examples where the channels correspond to color components.

Another example can include any of the above and/or below examples where the interpolation value interpolates between the local minimum and the local maximum.

Another example can include any of the above and/or below examples where the method further comprises determining a global range for the data set, the global range including a global minimum and a global maximum and encoding the local minimum for the particular region as a relative value in reference to the global minimum.

Another example can include any of the above and/or below examples where the method further comprises encoding the local maximum for the particular region as a maximum delta value in reference to the local minimum.

Another example includes a computer-readable storage medium storing instructions which, when executed by a processor, cause the processor to receive a mip chain including a first mipmap having a first resolution and a second mipmap having a second resolution that is half of the first resolution, partition the first mipmap into a plurality of first blocks having a first block size, partition the second mipmap into a plurality of second blocks having a second block size that is half of the first block size, and for a particular first block determining a local range for the particular first block, the local range including a local minimum and a local maximum, encoding first data in the particular first block as a first interpolation value within the local range, using the local range for a particular second block that corresponds to the particular first block, and encoding second data in the particular second block as a second interpolation value within the local range.

Another example can include any of the above and/or below examples where the first blocks and the second blocks include texels.

Another example can include any of the above and/or below examples where the first data and the second data represent color.

Another example can include any of the above and/or below examples where the first interpolation value and the second interpolation value interpolate between the local minimum and the local maximum.

The invention claimed is:

1. A system, comprising:
  a processor; and
  a storage storing instructions which, when executed by the processor, cause the processor to:
    partition a data set into regions;
    generate a minmax map for the data set; and
    for a particular region:
      determine a local range for the particular region, the local range including a local minimum and a local maximum;
      store the local minimum and the local maximum for the particular region in the minmax map;
      determine a number of bits available to encode data in the particular region;
      calculate a step size based on the number of bits, the local minimum, and the local maximum; and
      encode the data in the particular region using the number of bits as an interpolation value within the local range based on the step size and in reference to the local minimum or the local maximum.

2. The system of claim 1, wherein the data set includes a mesh, and the particular region includes a meshlet.

3. The system of claim 1, wherein the data represents a vertex position and/or vertex attributes.

4. The system of claim 1, wherein the particular region includes data for a plurality of axes, and wherein the instructions, when executed by the processor, further cause the processor to:
  allocate the number of bits among the plurality of axes based on relative variances of the data among the plurality of axes in the particular region.

5. The system of claim 1, wherein the particular region includes data for a plurality of axes, and wherein the instructions, when executed by the processor, further cause the processor to:
  for the particular region, determine a plurality of local ranges corresponding to the plurality of axes.

6. The system of claim 1, wherein one of the local minimum or the local maximum for the particular region is encoded as a delta in the minmax map.

7. The system of claim 1, wherein the instructions, when executed by the processor, further cause the processor to:
  determine a global range for the data set, the global range including a global minimum and a global maximum; and
  encode the local minimum for the particular region as a relative value in reference to the global minimum.

8. The system of claim 7, wherein the data represents a position of a vertex, and wherein the instructions, when executed by the processor, further cause the processor to:
  determine that the vertex is included in more than one region; and encode the data for the vertex as an interpolation value in reference to the global minimum or the global maximum.

9. A method, comprising:
partitioning a data set into regions; and
for a particular region:
  determining a local range for the particular region, the local range including a local minimum and a local maximum;
  encoding the local maximum for the particular region as a maximum delta value in reference to the local minimum; and
  encoding data in the particular region as interpolation values within the local range.

10. The method of claim 9, wherein the data set includes a texture, and the particular region includes a block of texels in the texture.

11. The method of claim 9, wherein the data represents color.

12. The method of claim 9, wherein the particular region includes data for a plurality of channels, the method further comprising:
  allocating bits among the plurality of channels based on relative variances of the data among the plurality of channels for the particular region.

13. The method of claim 12, wherein the channels correspond to color components.

14. The method of claim 9, wherein each of the interpolation values, respectively, interpolates between the local minimum and the local maximum.

15. The method of claim 9, further comprising:
  determining a global range for the data set, the global range including a global minimum and a global maximum; and
  encoding the local minimum for the particular region as a relative value in reference to the global minimum.

16. A non-transitory computer-readable storage medium storing instructions which, when executed by a processor, cause the processor to:
  receive a mip chain including a first mipmap having a first resolution and a second mipmap having a second resolution that is half of the first resolution;
  partition the first mipmap into a plurality of first blocks having a first block size;
  partition the second mipmap into a plurality of second blocks having a second block size that is half of the first block size; and
  for a particular first block:
    determine a local range for the particular first block, the local range including a local minimum and a local maximum;
    encode first data in the particular first block as a first interpolation value within the local range;
    use the local range for a particular second block that corresponds to the particular first block; and
    encode second data in the particular second block as a second interpolation value within the local range.

17. The computer-readable storage medium of claim 16, wherein the first blocks and the second blocks include texels.

18. The computer-readable storage medium of claim 16, wherein the first data and the second data represent color.

19. The computer-readable storage medium of claim 16, wherein the first interpolation value and the second interpolation value interpolate between the local minimum and the local maximum.

20. A non-transitory computer-readable storage medium storing instructions which, when executed by a processor, cause the processor to perform operations to decompress a data set that has been partitioned into regions, the operations comprising, for a particular region:
  decoding a local maximum for the particular region as a maximum delta value in reference to a local minimum for the particular region;
  determining a local range for the particular region, the local range including the local minimum and the local maximum; and
  decoding data in the particular region as interpolation values within the local range.

21. The computer-readable storage medium of claim 20, wherein the data set includes a texture, and the particular region includes a block of texels in the texture.

22. The computer-readable storage medium of claim 20, wherein the particular region includes data for a plurality of channels, and wherein bits have been allocated among the plurality of channels based on relative variances of the data among the plurality of channels for the particular region.

23. The computer-readable storage medium of claim 20, wherein the operations further comprise:
  determining a global range for the data set, the global range including a global minimum and a global maximum; and
  decoding the local minimum for the particular region as a relative value in reference to the global minimum.

* * * * *